United States Patent
Poulsen

(10) Patent No.: US 7,630,504 B2
(45) Date of Patent: Dec. 8, 2009

(54) MICROPHONE COMPRISING INTEGRAL MULTI-LEVEL QUANTIZER AND SINGLE-BIT CONVERSION MEANS

(75) Inventor: Jens Kristian Poulsen, Hedehusene (DK)

(73) Assignee: Epcos AG, Munich (DE)

( * ) Notice: Subject to any disclaimer, the term of this patent is extended or adjusted under 35 U.S.C. 154(b) by 252 days.

(21) Appl. No.: 10/580,505

(22) PCT Filed: Oct. 8, 2004

(86) PCT No.: PCT/DK2004/000680

§ 371 (c)(1),
(2), (4) Date: May 23, 2006

(87) PCT Pub. No.: WO2005/009072

PCT Pub. Date: Jan. 27, 2005

(65) Prior Publication Data

US 2007/0127761 A1      Jun. 7, 2007

Related U.S. Application Data

(60) Provisional application No. 60/525,039, filed on Nov. 24, 2003.

(51) Int. Cl.
*H04R 3/00* (2006.01)
(52) U.S. Cl. .................. 381/111; 381/355; 341/143; 341/155; 341/159
(58) Field of Classification Search ........... 381/111, 381/355; 341/143, 155, 159
See application file for complete search history.

(56) References Cited

U.S. PATENT DOCUMENTS

| | | | | |
|---|---|---|---|---|
| 5,051,799 A | * | 9/1991 | Paul et al. | 375/242 |
| 5,769,848 A | | 6/1998 | Wattanasirichaigoon | 606/46 |
| 5,886,656 A | * | 3/1999 | Feste et al. | 341/143 |
| 6,028,946 A | * | 2/2000 | Jahne | 381/122 |
| 6,198,417 B1 | * | 3/2001 | Paul | 341/143 |
| 6,326,912 B1 | * | 12/2001 | Fujimori | 341/143 |
| 6,449,370 B1 | * | 9/2002 | Yasuno et al. | 381/71.6 |
| 6,958,717 B1 | * | 10/2005 | Minogue | 341/102 |
| 7,274,716 B2 | * | 9/2007 | Hochschild | 370/538 |

(Continued)

FOREIGN PATENT DOCUMENTS

EP            1 052 880 A2        11/2000

(Continued)

OTHER PUBLICATIONS

Tzartzanis, Nesoras; "Clock-Powered CMOS: A Hybrid Adiabatic Logic Style for Energy-Efficient Computing"; Feb. 9, 2000; Solid-State Circuits Conference, 2000. Digest of Technical Papers. ISSCC. 2 IEEE International; pp. 296-297.*

(Continued)

*Primary Examiner*—Huyen D Le
*Assistant Examiner*—Ryan C Robinson
(74) *Attorney, Agent, or Firm*—Nixon Peabody LLP

(57) ABSTRACT

The invention relates to a digital microphone comprising an integral analog-to-digital converter based on a multi-level quantizer in cascade with a digital signal converter which is adapted to provide a single-bit output signal. Digital microphones in accordance with the invention are particularly well adapted for use in mobile terminals and compact portable communication equipment such as mobile or cellular phones, headsets, hearing prostheses etc.

19 Claims, 5 Drawing Sheets

U.S. PATENT DOCUMENTS

2003/0223592 A1* 12/2003 Deruginsky et al. ............ 381/92
2003/0235315 A1* 12/2003 Reesor ........................ 381/115
2007/0127761 A1* 6/2007 Poulsen ....................... 381/355

FOREIGN PATENT DOCUMENTS

| EP | 1052880 A2 * | 11/2000 |
| GB | 2 319 922 A | 6/1998 |
| GB | 2319922 A * | 6/1998 |
| WO | WO 02/062101 A1 | 8/2002 |
| WO | WO 03/023970 A2 | 3/2003 |
| WO | WO 03/088709 A1 | 10/2003 |

OTHER PUBLICATIONS

An Audio Engineering Society Preprint, "One Bit Digital Processing Of Audio Signals"; Presented at the 95$^{th}$ Convention Oct. 7-10, 1993 New York; N.M. Casey and James A. S. Angus—The University of New York; 16 pages.

"A Single-path Multi-bit DAC for LP ΔΣ A/D Converters" Loai Louis and Gordon W. Roberts—Department of Electrical Engineering, McGill University—4 pages, 1998.

* cited by examiner

MICROPHONE COMPRISING INTEGRAL MULTI-LEVEL QUANTIZER AND SINGLE-BIT CONVERSION MEANS

CROSS REFERENCE TO RELATED APPLICATIONS

This application is a U.S. national phase of International Application No. PCT/DK2004/000680, filed Oct. 8, 2004, which claims the benefit of priority of U.S. Provisional Patent Application No. 60/525,039, filed Nov. 24, 2003, both of which are incorporated by reference in its entirety.

FIELD OF THE INVENTION

The invention relates to a digital microphone comprising an integral analog-to-digital converter based on a multi-level quantizer in cascade with a digital signal converter which is adapted to provide a single-bit output signal. Digital microphones in accordance with the invention are particularly well adapted for use in mobile terminals and compact portable communication equipment such as mobile or cellular phones, headsets, hearing prostheses etc.

BACKGROUND OF THE INVENTION

Microphones with integral analog-to-digital converters, or digital microphones, are known in the art. EP 1 052880, WO 02/062101, U.S. Pat. No. 5,769,848 and GB 2319922 discloses several digital microphones for utilization in diverse applications such as professional audio, hearing instruments and mobile phones. WO 02/062101 discloses a microphone assembly comprising an electro-acoustical transducer coupled to a preamplifier. An amplified signal is coupled to an analog-to-digital converter which in one embodiment comprises a single-bit delta-sigma modulator. A disclosed embodiment of the microphone assembly comprises a formatting circuit that converts signal samples generated by the delta-sigma modulator into digital signals in accordance with a standardized digital audio transmission protocol such as S/PDIF, I2S or AES/EBU.

U.S. Pat. No. 6,326,912 discloses an analog-to-digital converter comprising a front-end multi-bit delta-sigma modulator coupled directly, or indirectly, to a back-end single-bit delta-sigma modulator for professional audio applications such as Super Audio Compact Discs that are based on a bit stream format or DVD Audio Discs that are based on a 24-bit PCM format.

While single-bit sigma-delta modulators have been successfully incorporated in a commercially available miniature microphone for hearing aid applications, there is a need for digital microphones employing integral analog-to-digital converters of improved performance. The improved digital microphones could advantageously be backward compatible with existing single-bit output devices. Improved performance analog-to-digital converters can be obtained by replacing conventional single-bit, or dual-level, quantizers with a multi-level quantizer in sigma-delta converter architectures.

DESCRIPTION OF THE INVENTION

In a first aspect, the invention relates to a digital microphone comprising a microphone housing having a sound inlet and comprising a transducer element comprising a displaceable diaphragm and adapted to generate a transducer signal representative of sound received through the sound inlet, an analog-to-digital converter comprising a multi-level quantizer operatively coupled to the transducer means to convert the transducer signal into multi-bit samples representative of the transducer signal, a digital signal converter adapted to convert the multi-bit samples into a single-bit output signal, and an externally accessible terminal adapted to provide the single-bit output signal.

In the present description and claims, the term "multi-level quantizer" designates a signal quantizer that comprises more than 2 quantization levels such as 3 or 5 or 7 discrete quantization levels.

A significant advantage of the invention is provided by the multi-level quantizer operatively coupled to the digital signal converter which converts the multi-bit samples into a single-bit output signal. The present invention therefore provides a digital microphone which benefits from the multi-level quantizer to provide a digitized version of the transducer signal of improved quality, but still maintains a simple and versatile unformatted data output which previously have been a unique feature of analog-to-digital converters based on single bit quantizers. By virtue of the unformatted single-bit output signal, microprocessors or signal processors are readily interfaced to digital microphones in accordance with the present invention without any need to contain dedicated audio data interface circuitry compatible with several digital audio data protocols.

Finally, designers of products that incorporate digital microphones in accordance with the invention enjoy a considerable flexibility in choosing an optimum performance versus complexity trade-off in for example decimation filter design.

The multi-level quantizer preferably comprises between 3 and 64 quantization levels such as between 5 and 16 quantization levels to provide multi-bit samples representative thereof. The quantization levels may be selected so as to provide linear or equidistant amplitude spacing, or logarithmic amplitude spacing, or any other desired amplitude spacing. The multi-level quantizer provides several benefits in comparison with a single-bit quantizer. These improvements include, but are not limited to, lower power consumption for a given signal/noise ratio, improved signal/noise ratio for a given sampling frequency and improved suppression of annoying tonal noise components in the multi-bit samples or quantized signal.

For a desired or target signal-to-noise ratio or dynamic range of the quantized signal, it is possible to reduce a clock frequency driving the analog-to-digital converter. This latter advantage is particularly beneficial when the digital microphone comprises an external input clock terminal for receipt of an externally generated clock signal such as a clock signal generated by an associated microprocessor or digital signal processor. In this latter embodiment of the invention, power losses associated with driving external parasitic capacitances on a clock line are reduced proportionally with the frequency of the externally generated clock signal.

Preferably, the digital microphone comprises a preamplifier inserted between the transducer element and the analog-to-digital converter. The input capacitance of the preamplifier may advantageously be selected or designed to be suitable for coupling the preamplifier input to a miniature transducer element, said input capacitance being smaller than 10 pF or smaller than 5 pF or 2 pF or 1 pF, or even more preferably less than 0.5 pF. This latter range of input capacitance values will optimize coupling of the preamplifier to miniature electret or condenser based transducer elements as commonly used in miniature microphones for hearing aid or mobile terminal applications.

A DC blocking filter, such as a band pass or high pass filter may advantageously be operatively coupled to a preamplifier output providing an amplified transducer signal so as to prevent DC bias point fluctuations and/or low frequency signals at the preamplifier output are conveyed to the analog-to-digital converter.

The digital microphone may comprise a dynamic transducer element or condenser transducer element. The dynamic transducer element may comprise a diaphragm with an attached voice coil suspended in a permanent magnetic field. The condenser transducer element may comprise a pair of closely spaced and suitably biased plates, such as a polymer diaphragm having an electrically conductive layer disposed thereon and an adjacently positioned perforated backplate.

Alternatively, the transducer means may be formed in a semiconductor substrate such as silicon or any other suitable material using Micro Electro Mechanical Systems (MEMS) technologies. In the above-mentioned embodiments of the invention, the preamplifier, the analog-to-digital converter, the digital signal converter and, optionally, clock generating means may advantageously be formed on a common integrated circuit substrate. The preamplifier may be electrically coupled to the transducer means or element by utilization of flip-chip or wire-bonding techniques.

The analog-to-digital converter preferably comprises an oversampled delta-sigma modulator adapted to sample the transducer signal or preamplifier signal with a clock signal frequency between 64 kHz and 512 kHz. For a desired or target audio bandwidth of 8 kHz, this clock signal frequency span corresponds to oversampling ratios of 4 and 32, respectively.

According to one embodiment of the invention, the digital microphone comprises an integral clock generator adapted to generate a clock signal which is operatively coupled to the analog-to-digital converter to provide a sampling clock for the multi-level quantizer. An advantageous feature of this embodiment is a possibility to provide a digital microphone with no requirement for an externally accessible clock input terminal. The sampling clock signal of the analog-to-digital converter and, optionally, internal logic circuitry may be operated in by the internally generated clock signal or clock signal derived there from.

Alternatively, the housing of the digital microphone may comprise a second externally accessible terminal for receipt of an external clock signal. The external clock signal is operatively coupled to the analog-to-digital converter to directly or indirectly control the sampling of the transducer signal. In an advantageous version of this latter embodiment of the digital microphone, the external clock signal is operatively coupled to DC voltage generating means disposed within the microphone housing and used to derive power for an internal DC supply voltage. The internal DC supply voltage may power at least the analog-to-digital converter and, optionally, all circuitry within the digital microphone such as a preamplifier, interpolation and decimation filters. This latter embodiment of the invention is therefore operative without a separate power supply terminal or pad on the microphone housing. The lack of the separate power supply terminal is particularly advantageous for miniature low-power digital microphones such as digital hearing aid microphones that may have a nominal current consumption of less than 250 µA or less than 150 µA at 1.0 Volt supply voltage. In a preferred embodiment of the invention, the digital microphone is adapted to operate on a supply voltage lower than 2.9 V or lower than 1.8 Volt such as lower than 1.5 Volt or lower than 1.2 Volt.

According to a preferred embodiment of the invention, interpolation means or an interpolator is inserted between the analog-to-digital converter and the digital signal converter to interface between different sample rates of the multi-bit samples and the single-bit output signal. The interpolator may advantageously comprise a low pass filter and be adapted to raise the sample rate with a factor of 2-32.

The multi-bit samples provided by the analog-to-digital converter may be represented by a two's complement data format and conveyed to an interpolator or decimator in that format. In contrast, in accordance with a particularly advantageous embodiment of the invention, the multi-bit samples provided by the analog-to-digital converter are represented by a set of corresponding symbols wherein each symbol comprises a number of one signs proportional with a magnitude of the corresponding multi-bit sample. This symbol representation is particularly advantageous in connection with three and five level modulators since an efficient and direct mapping between multi-bit samples and the single bit output is possible, but generally a multi-level quantizer comprising N discrete quantization levels may utilize corresponding symbols that comprises N−1 bits to represent each of the N levels with a unique symbol.

According to a second aspect of the invention, a portable communication device comprises a digital microphone according to the present invention. The portable communication device may be powered by disposable or rechargeable batteries and optimized for low-power operation. The portable communication device may comprise a mobile terminal, a cellular phone, a headset, a hearing prosthesis or instrument etc.

According to a third aspect of the invention, a monolithic integrated circuit comprises a preamplifier adapted to provide an amplified transducer signal and comprising an input section couplable to a miniature electret or condenser transducer element and an analog-to-digital converter comprising a multilevel-quantizer operatively coupled to the amplified transducer signal and adapted to convert the amplified transducer signal into multi-bit samples representative of the amplified transducer signal and a digital signal converter adapted to convert the multi-bit samples into a single-bit output signal. An integrated circuit pad is finally adapted to provide the single-bit output signal.

The monolithic integrated circuit may be fabricated in a standard CMOS process such as 0.5 µm or 0.35 µm CMOS. The input impedance of the preamplifier of the monolithic circuit is preferably substantially capacitive and corresponding to a capacitance less than 2 pF, or less than 1 pF, or even more preferably less than 0.5 pF to support interfacing or coupling to a miniature electret element without introducing unacceptable signal losses by source loading effects.

DETAILED DESCRIPTION OF A PREFERRED EMBODIMENT

Figure 1:
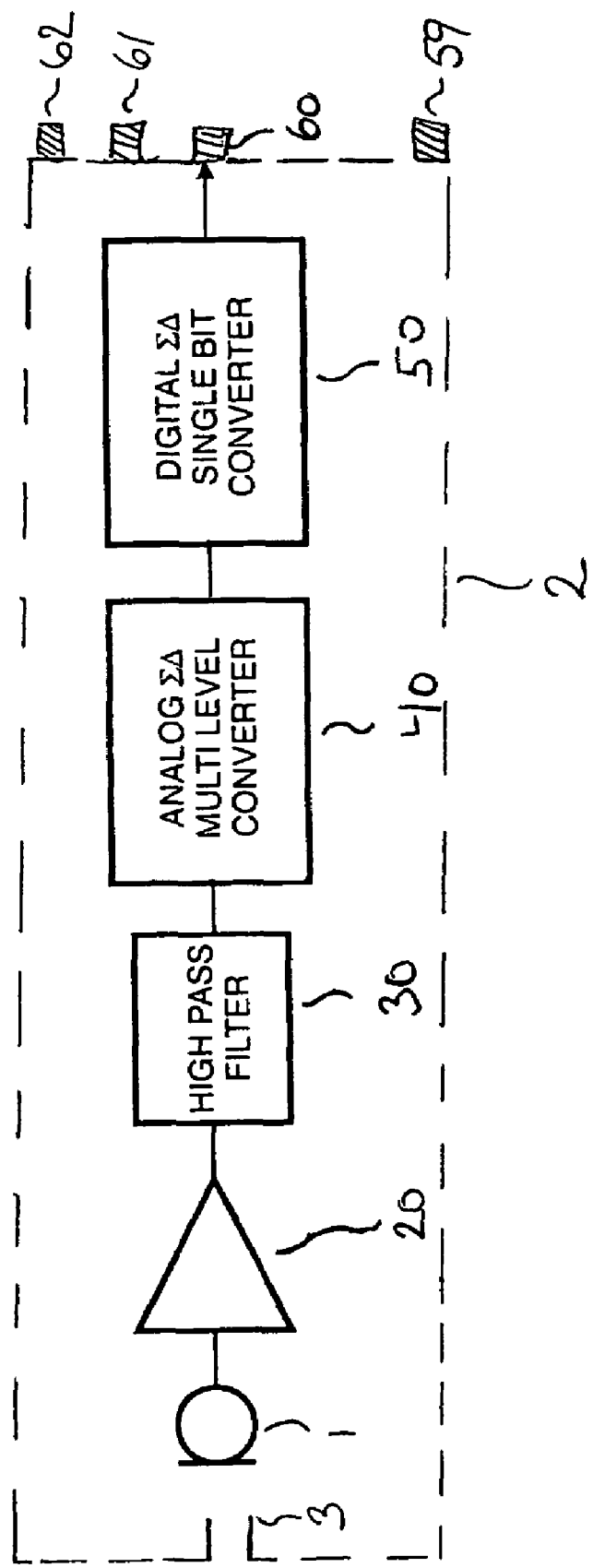
FIG. 1 is a block diagram of a digital microphone assembly according to a preferred embodiment of the present invention.

FIG. 1 shows a preferred embodiment of a digital microphone according to the invention. The digital microphone comprises a housing or casing 2 with a sound inlet port 3. An electret transducer element 1 is electrically coupled to an integrated circuit and both arranged inside the housing 2. The integrated circuit comprises preamplifier 20, high pass filter 30, analog multilevel converter 40 and a digital signal converter 50. The integrated circuit is mounted on, and supported by, a ceramic substrate carrier (not shown) while electrical connectivity between devices is established by wire-bonding techniques that are well-known in the art.

The present embodiment of the invention is implemented as a sub-miniature electret microphone capable of operating on supply voltages down to 1.0 Volt and with a typical power consumption of about 100-200 µW. The present embodiment is therefore particularly well adapted for hearing instrument applications where low-voltage and low-power requirements are essential to conserve battery power. The digital microphone additionally comprises a set of externally accessible terminals in form of an output signal terminal 60, a clock input terminal 61, a power supply terminal 62 and a ground terminal 59. The clock input terminal 61 is adapted for receipt of an externally generated clock signal which controls timing and clock rate of the single-bit output signal on output signal terminal 60 to provide a simple and synchronous interface between the digital microphone and the external processor.

Alternatively, in respect of applications wherein a key concern is to minimize the number of external terminals, the single-bit output signal may be transmitted asynchronously or synchronously to the external processor through a single data line. The processor must include appropriate data receipt and clock retrieval means. In an embodiment of the invention wherein the single-bit output signal is transmitted synchronously to the external processor through a single data line, the single-bit output signal or output data may advantageously comprise an embedded or coded clock signal such as a Manchester coded composite clock/data line wherein the embedded clock signal is derived from an integral clock generator means disposed on the integrated circuit.

The electret transducer element 1 comprises a displaceable diaphragm adapted to receive an acoustical signal through the sound inlet 3 and generate a transducer signal representative of the acoustical signal. The transducer signal is conveyed to a low-power and low-noise CMOS based preamplifier 20 adapted to amplify and buffer the transducer signal and provide an amplified transducer signal to the analog multilevel converter 40 or sigma-delta (SD) modulator, which comprises a multilevel-quantizer so as to convert the amplified transducer signal into a multi-bit samples representative of the transducer signal. According to the present embodiment of the invention, the multi-level quantizer comprises three discrete levels represented as +1, 0 and −1. Other embodiments may comprise a larger number of discrete quantization levels such as 5 levels or 8 levels or 16-64 levels depending on factors such as performance, tolerable complexity and size of the integrated circuit itself.

The multi-bit samples provided by SD modulator 40 are operatively coupled to the digital signal converter 50 adapted to convert the multi-level digital signal into a single-bit output signal. Finally, the single-bit output signal is made accessible to an external programmable processor such as a signal processor or microprocessor through an externally accessible terminal 60 placed on the ceramic hybrid substrate and electrically connected to a corresponding terminal of the integrated circuit. The integrated circuit of the present embodiment of the invention is preferably manufactured by 0.35 µm CMOS that provides low-noise and high performance analog PMOS transistors for application in the preamplifier 20 combined with high-density and low power digital logic circuitry for application in the digital logic circuitry of digital signal converter 50. However, other CMOS processes having larger or smaller feature sizes as well as BiCMOS process could alternatively be utilized.

Figure 2:
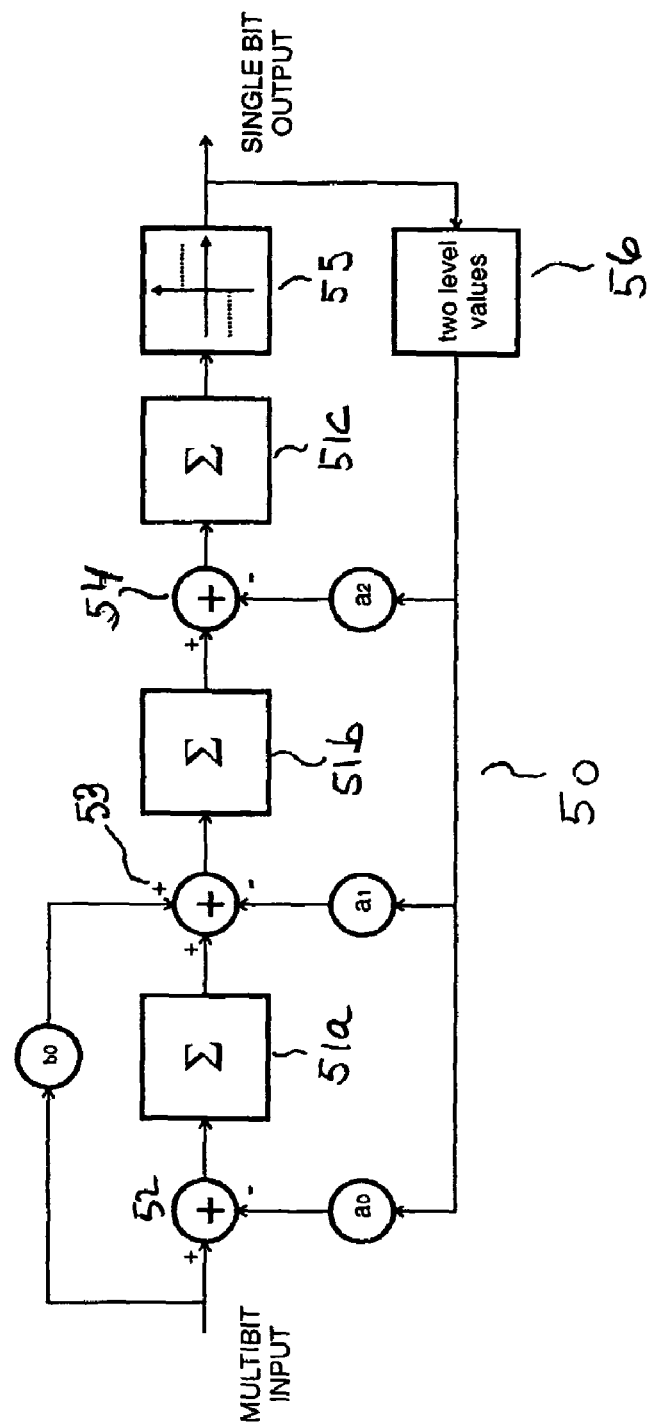
FIG. 2 is a block diagram of a first digital signal converter for use in the digital microphone assembly illustrated in FIG. 1.

FIG. 2 is a detailed block diagram of a first embodiment of the digital signal converter 50 illustrating individual parts or components of the converter 50 in more detail. The digital signal converter 50 is compatible with an analog multilevel converter or delta-sigma multi-level quantizer in which multi-bit samples are represented in a conventional two's complement format.

A forward signal path comprises three cascaded discrete two's complement integrators 51a, 51b, 51c located in front of single-bit quantizer or comparator 55 that quantizes incoming 16 bit digital signal samples into a bi-level, or single-bit, output signal. The input signal to the converter 50 is a 2 bit signal provided in two's complement format. A feedback loop extends around the forward signal path and comprises a single-bit decision circuit or comparator 56 that feeds a MSB value, or sign, of the single-bit output signal back to three separate feedback loops with respective feedback coefficients, $a_0$, $a_1$, $a_2$. These three separate feedback loops feed respective feedback signals into respective summing junctions or 16 bit adders 52-54 to provide error or noise shaping in the digital signal converter 50. The noise shaping operates to move or transpose low-frequency noise components, introduced as a result of signal quantization of the multi-bit input signal, to a high-frequency range above audibility. A feed-forward loop with a predetermined feed-forward coefficient, $b_0$, around the first adder 51 may as illustrated optionally be added to the digital signal converter 50 to improve its dynamic range and stability. Internal state variables or signals e.g. at summing nodes 52-54 are preferably represented by respective 16 bit two's complement numbers.

Figure 3:
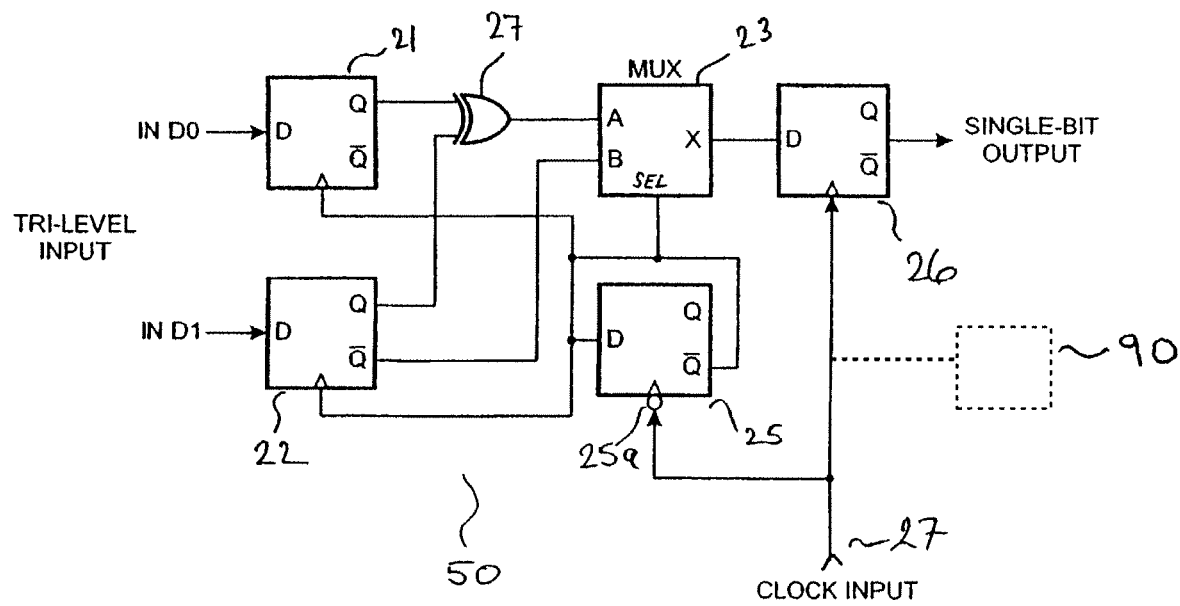
FIG. 3 is a block diagram of a second alternative digital signal converter for use in the digital microphone assembly illustrated in FIG. 1.

FIG. 3 illustrates another embodiment of the digital signal converter 50 based on direct symbol mapping. This implementation of the digital signal converter 50 requires a minimum of logic circuitry and therefore represents a very attractive option for low-power and/or low cost applications like hearing instruments and mobile phones. The operation is based on a novel coding of the two bit samples {D0, D1} provided in standard two's complement format by the tri-level sigma-delta (SD) modulator 40 (FIG. 1).

In the present embodiment, quantization level +1 is coded as symbol {11}, while level 0 is represented by symbol {01}, and level −1 is finally represented by symbol {00}. Accordingly, a symbol associated with a particular quantization level directly represents the average signal value of that quantization level by the coding mechanism of the digital signal converter 50. This coding form makes it possible to generate the single-bit output signal in a very efficient manner by a collection of four D-type Flip Flops 21, 22, 25 and 26, a dual-input multiplexer 26 and XOR gate 27. D-FF 25 is operative to halve a clock frequency provided on the clock input 25*a* wherein the clock frequency signal may have been derived from the external clock signal terminal 61 (FIG. 1). Optionally, a DC voltage generating means 90 can be disposed within the microphone housing and operatively coupled to the external clock signal 27. D-type FFs 21 and 22 operates on half the clock frequency of D-type FF 26 that generates the single bit output signal or bit-stream and the Nyquist criterion is exactly complied with by direct coding and conversion of incoming multi-bit samples.

Clearly, a different coding of the symbols or multi-bit samples is possible within the general inventive concept such as representing level +1 by symbol {1111} or {111111} and the other quantization levels in a corresponding manner. Likewise, the symbols that represent +1 and −1 can both be inverted and/or the 0 level coded "01} or "10}. Likewise, several efficient coding formats of quantization levels provided by a five-level SD modulator also exist, e.g. by using a collection symbols that each comprises four bits to represent the corresponding quantization level, such as below-mentioned exemplary format:

Level +2 is represented by symbol {1111},
Level +1 is represented by symbol {1110},
Level 0 is represented by symbol {1010},
Level −1 is represented by symbol {0001},
Level −2 is represented by symbol {0000}.

Figure 4:
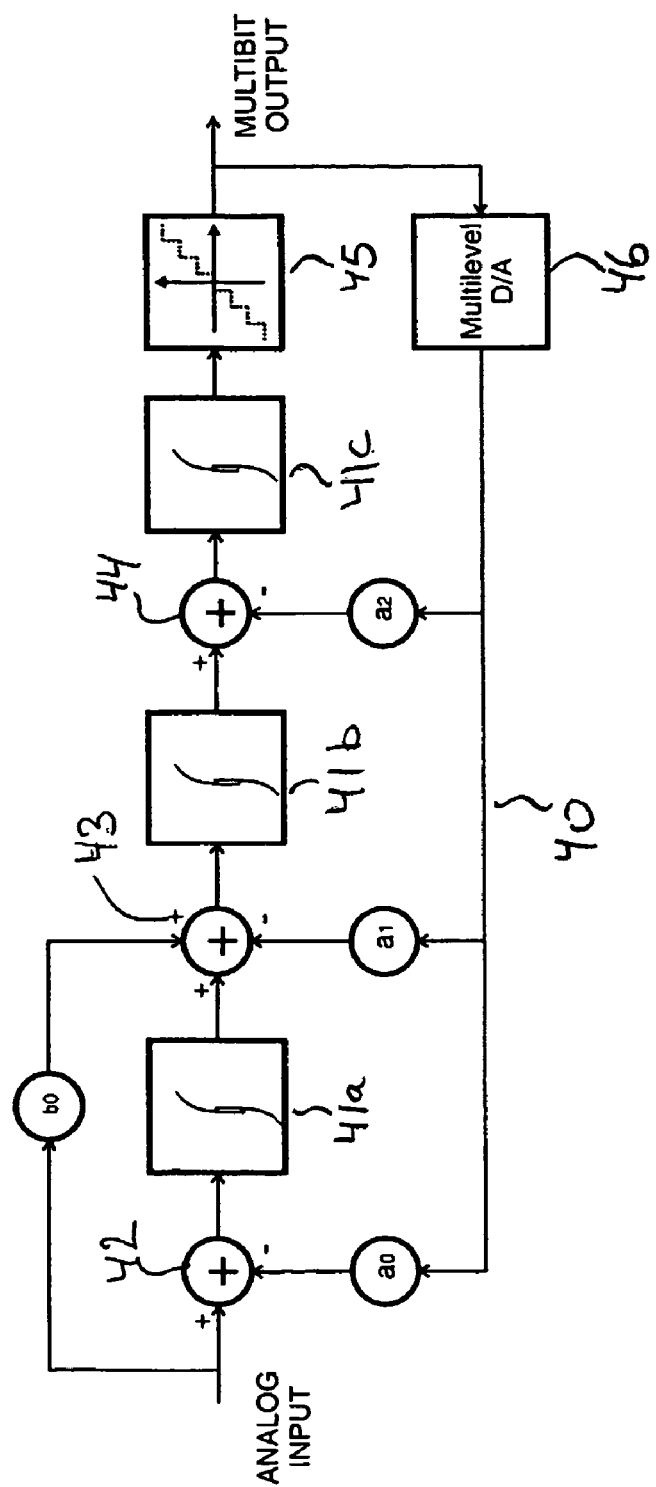
FIG. 4 is a block diagram of a three-level sigma-delta based AD converter.

FIG. 4 is a detailed block diagram of the analog multi-level SD modulator 40 or SD modulator illustrating individual components of the modulator 40. The amplified transducer signal is provided as an analog input signal to the SD modulator, which converts received input signals into a multi-bit samples output representative of the transducer signal. A cascade of three integrators, 41*a*-41*c* is located in a forward signal path of the SD modulator 40. An output of a last integrator 41*c* is operatively coupled to a three-level quantizer 45 that quantizes amplitude values of a continuous-time signal at the output of integrator 41*b* into a dual-bit digital signal samples in two's complement format. A feedback loop around the SD modulator comprises a multilevel digital-to-analog converter 46 that feeds a value of the multi-bit samples output signal back to three separate feedback loops with respective feedback coefficients, $a_0$, $a_1$ and $a_2$. These three separate feedback loops feed respective feedback signals into respective summing junctions 42-44 to provide error shaping in the SD modulator 40 and transpose or push a substantial portion of quantization noise generated by the three-level quantizer 45 to a frequency range above audibility, i.e. above about 16 or 20 kHz. An optional feed-forward loop with a predetermined feed-forward coefficient, $b_0$, around the first integrator 41*a* has been added to the SD modulator 40 as illustrated to improve its dynamic range and stability.

The present SD modulator 40 is preferably operated with a sampling clock frequency of 1.024 MHz while the digital signal converter 50 is operated with a 2.048 MHz output data rate of the single-bit output signal. In the present embodiment of the invention, an interpolator is inserted between the SD modulator 40 and the digital signal converter 50, in accordance with FIG. 2, to raise the sampling rate of the multi-bit samples provided by the SD modulator to a target rate of 2.048 MHz required by the digital signal converter 50.

Figure 5:
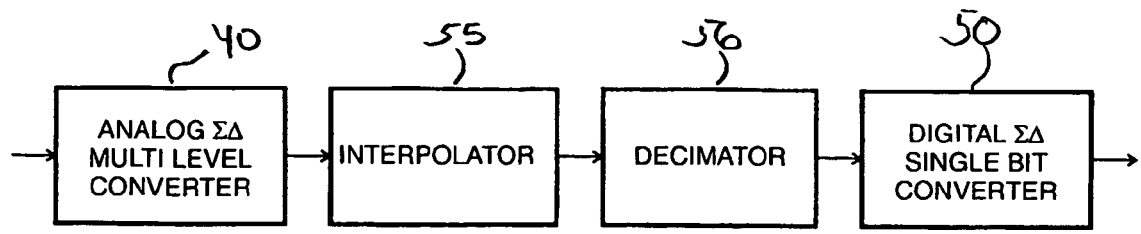
FIG. 5 is a block diagram of a first interface processing circuitry between the three-level sigma-delta based AD converter and the digital signal converter.
Figure 6:
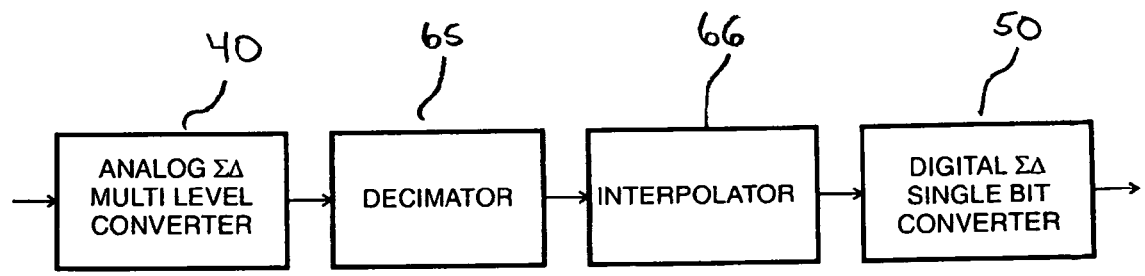
FIG. 6 is a block diagram of a second interface processing circuitry between the three-level sigma-delta based AD converter and the digital signal converter.

As illustrated in FIG. 5 and FIG. 6 various types of sample rate conversion may be provided in-between the SD modulator 40 and the digital signal converter 50. According to FIG. 5, an interpolator 55 and decimator 56 may be cascaded to provide flexible sample rate conversion between the sample rate of signals provided by the SD modulator 40 and the sample rate of the output signal of digital signal converter 50 wherein a ratio between the sample rates may be an integer or fractional number such as 4, 8, 16, 32 or 1.5 or 32/44.1 or 16/44.1 etc. According to FIG. 6, the sample rate conversion means may comprise a cascade of a decimator 65 and an interpolator 66. Inclusion of appropriate sample rate conversion means may be advantageous in some embodiments of the invention to interface a certain sample rate of signals from the SD modulator 40 to a standardized data output rate required by the digital signal converter 50.

The invention claimed is:

1. A digital microphone comprising:
   a microphone housing having a sound inlet and comprising:
      a transducer element comprising a displaceable diaphragm and adapted to generate a transducer signal representative of sound received through the sound inlet,
      an analog-to-digital converter comprising a multi-level quantizer operatively coupled to the transducer element to convert the transducer signal into multi-bit samples representative of the transducer signal, the multi-level quantizer having at least three discrete quantization levels, each of the discrete quantization levels being represented by a set of corresponding symbols, each symbol comprises a number of one signs, the number of one signs being proportional with a magnitude of the transducer signal represented by the corresponding multi-bit sample,
      a digital signal converter adapted to convert the multi-bit samples into an unformatted single-bit output signal, and
      an externally accessible terminal adapted to provide the unformatted single-bit output signal.

2. A digital microphone according to claim 1, wherein the analog-to digital converter comprises an oversampled delta-sigma modulator.

3. A digital microphone according to claim 1, comprising an integral clock generator operatively coupled to the analog-to-digital converter and the digital signal converter.

4. A digital microphone according to claim 1, wherein the microphone housing comprises a second externally accessible terminal for receipt of an external clock signal.

5. A digital microphone according to claim 4, comprising a DC voltage generating means for deriving a DC voltage supply for operating at least the analog-to-digital converter, the DC voltage supply means being disposed within the microphone housing and operatively coupled to the external clock signal.

6. A digital microphone according to claim 1, wherein the multi-level quantizer of the analog-to-digital converter comprises between 3 and 64 discrete quantization levels.

7. A digital microphone according to claim 1, wherein the multi-bit samples provided by the analog-to-digital converter are represented in two's complement format.

8. A digital microphone according to claim 1, wherein the multi-level quantizer comprises 3 or 5 discrete quantization levels.

9. A digital microphone according to claim 1, wherein the multi-level quantizer comprises N discrete quantization levels and each corresponding symbol comprises N−1 bits; N being an integer between 3 and 17.

10. A digital microphone according to claim 8, wherein the digital signal converter comprises a delay circuit in cascade with an integer ratio upsampler.

11. A digital microphone according to claim 1, comprising a preamplifier interposed between the transducer element and the analog-to-digital converter.

12. A digital microphone according to claim 1, comprising an interpolator operatively coupled between the multi-bit samples provided by the analog-to-digital converter and the digital signal converter.

13. A portable communication device comprising a digital microphone according to claim 1.

14. A monolithic integrated circuit for a miniature microphone, comprising:
- a preamplifier adapted to provide an amplified transducer signal and comprising an input section couplable to a miniature electret or condenser transducer element,
- an analog-to-digital converter comprising a multilevel-quantizer operatively coupled to the amplified transducer signal and adapted to convert the amplified transducer signal into multi-bit samples representative of the amplified transducer signal, the multi-level quantizer having at least three discrete quantization levels, each of the discrete quantization levels being represented by a set of corresponding symbols, each symbol comprises a number of one signs, the number of one signs being proportional with a magnitude of the transducer signal represented by the corresponding multi-bit sample,
- a digital signal converter adapted to convert the multi-bit samples into an unformatted single-bit output signal, and
- an integrated circuit pad adapted to provide the single-bit output signal.

15. A monolithic integrated circuit according to claim 14, wherein the analog-to-digital converter comprises an oversampled delta-sigma modulator.

16. A monolithic integrated circuit according to claim 14, wherein the multi-level quantizer of the analog-to-digital converter comprises 3 or 5 discrete quantization levels.

17. A digital microphone according to claim 1, wherein the digital signal converter is a sigma-delta signal converter.

18. A digital microphone according to claim 1, wherein:
- the analog-to-digital converter is a tn-level sigma-delta modulator, the tn-level sigma-delta modulator outputs two bit samples in standard two's format, and
- the digital signal converter comprises a first D-type Flip Flop, a second D-type Flip Flop, a third D-type Flip Flop, a fourth D-type Flip Flop, a dual-input multiplexer and an XOR gate, where:
  - the first D-type Flip Flop receives a clock frequency from a clock input and outputs a half frequency, the half frequency being half of the clock frequency,
  - the second D-type Flip Flop receives and operates on the half frequency, the second D-type Flip Flop further receives a first of the two bit samples from the analog-to-digital converter, the second D-type Flip Flop outputs from a non-inverted output a first signal,
  - the third D-type Flip Flop receives and operates on the half frequency, the third D-type Flip Flop further receives a second of the two bit samples from the analog-to-digital converter, the third D-type Flip Flop outputs a second signal from a non-inverted output and a third signal from an inverted output,
  - the XOR gate receives the first and second signals and outputs a fourth signal,
  - the multiplexer receives and operates on the half frequency, the multiplexer further receives the third and fourth signals, the multiplexer outputs a fifth signal,
  - the fourth D-type Flip Flop receives the clock frequency and the fifth signal signal, the fourth D-type Flip Flop outputs the unformatted single-bit output signal.

19. A monolithic integrated circuit according to claim 14, wherein:
- the analog-to-digital converter is a tri-level sigma-delta modulator, the tri-level sigma-delta modulator outputs two bit samples in standard two's format, and
- the digital signal converter comprises a first D-type Flip Flop, a second D-type Flip Flop, a third D-type Flip Flop, a fourth D-type Flip Flop, a dual-input multiplexer and an XOR gate, where:
  - the first D-type Flip Flop receives a clock frequency from a clock input and outputs a half frequency, the half frequency being half of the clock frequency,
  - the second D-type Flip Flop receives and operates on the half frequency, the second D-type Flip Flop further receives a first of the two bit samples from the analog-to-digital converter, the second D-type Flip Flop outputs from a non-inverted output a first signal,
  - the third D-type Flip Flop receives and operates on the half frequency, the third D-type Flip Flop further receives a second of the two bit samples from the analog-to-digital converter, the third D-type Flip Flop outputs a second signal from a non-inverted output and a third signal from an inverted output,
  - the XOR gate receives the first and second signals and outputs a fourth signal,
  - the multiplexer receives and operates on the half frequency, the multiplexer further receives the third and fourth signals, the multiplexer outputs a fifth signal,
  - the fourth D-type Flip Flop receives the clock frequency and the fifth signal signal, the fourth D-type Flip Flop outputs the unformatted single-bit output signal.

* * * * *

UNITED STATES PATENT AND TRADEMARK OFFICE
CERTIFICATE OF CORRECTION

| | | |
|---|---|---|
| PATENT NO. | : 7,630,504 B2 | Page 1 of 1 |
| APPLICATION NO. | : 10/580505 | |
| DATED | : December 8, 2008 | |
| INVENTOR(S) | : Poulsen | |

It is certified that error appears in the above-identified patent and that said Letters Patent is hereby corrected as shown below:

Column 9, Line 37, change "the analog-to-digital converter is a tn-level sigma-delta" to "the analog-to-digital converter is a tri-level sigma-delta"

Column 9, Line 38, change "modulator, the tn-level sigma-delta modulator outputs" to "modulator, the tri-level sigma-delta modulator outputs"

Signed and Sealed this

Sixteenth Day of March, 2010

David J. Kappos
*Director of the United States Patent and Trademark Office*

UNITED STATES PATENT AND TRADEMARK OFFICE
CERTIFICATE OF CORRECTION

PATENT NO. : 7,630,504 B2
APPLICATION NO. : 10/580505
DATED : December 8, 2009
INVENTOR(S) : Jens Kristian Poulsen It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 450 days.

Signed and Sealed this

Second Day of November, 2010

David J. Kappos
*Director of the United States Patent and Trademark Office*